US006388468B1

(12) United States Patent
Li

(10) Patent No.: US 6,388,468 B1
(45) Date of Patent: May 14, 2002

(54) CIRCUIT AND METHOD FOR OPERATING A MOSFET CONTROL CIRCUIT WITH A SYSTEM OPERATING VOLTAGE GREATER THAN A MAXIMUM SUPPLY VOLTAGE LIMIT

(75) Inventor: Kang Li, Windsor (CA)

(73) Assignee: Yazaki North America

( * ) Notice: Subject to any disclaimer, the term of this patent is extended or adjusted under 35 U.S.C. 154(b) by 0 days.

(21) Appl. No.: 09/651,481

(22) Filed: Aug. 30, 2000

(51) Int. Cl.$^7$ .......................................... H03K 19/0175
(52) U.S. Cl. ......................... 326/80; 327/333; 327/110
(58) Field of Search ............................. 326/80, 81, 82, 326/83; 327/427, 431, 434–437, 333, 108, 110

(56) References Cited

U.S. PATENT DOCUMENTS

| | | | |
|---|---|---|---|
| 4,841,166 A | | 6/1989 | Harnden ........................ 327/110 |
| 5,514,981 A | * | 5/1996 | Tam et al. ...................... 326/80 |
| 5,543,740 A | | 8/1996 | Wong ............................ 327/108 |
| 5,909,135 A | | 6/1999 | Baldwin et al. .............. 327/328 |
| 5,977,811 A | * | 11/1999 | Magazzu ....................... 327/333 |
| 6,107,860 A | * | 8/2000 | Vinciarelli .................... 327/427 |
| 6,211,706 B1 | * | 4/2001 | Choi et al. .................... 327/108 |
| 6,218,788 B1 | * | 4/2001 | Chen et al. ................... 315/225 |

\* cited by examiner

Primary Examiner—Tuan T. Lam
(74) Attorney, Agent, or Firm—Young & Basile

(57) ABSTRACT

A circuit and method for operating a MOSFET control circuit, having a maximum supply voltage limit, with a system operating voltage greater than the maximum supply voltage limit. The system operating voltage is referenced to a first ground. The MOSFET control circuit has a power supply input for receiving the system operating voltage and for generating a signal having a maximum voltage level and a minimum voltage level. A ground floating circuit includes a second ground, having a greater potential than the first ground, for establishing a voltage difference between the MOSFET control circuit power supply input and the second ground. The voltage difference being less than the maximum supply voltage limit. A first signal level shifting circuit shifts one of the maximum voltage level and the minimum voltage level of the signal from a first reference voltage to a second reference voltage. The method includes the steps of providing the MOSFET control circuit; establishing the voltage difference with the ground floating circuit including the second ground; and shifting one of the maximum voltage level and the minimum voltage level of the signal from a first reference voltage to a second reference voltage with a first signal level shifting circuit.

21 Claims, 9 Drawing Sheets

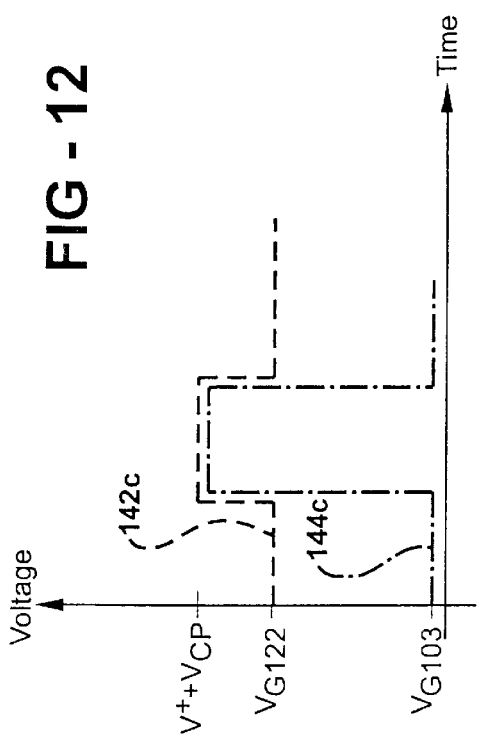
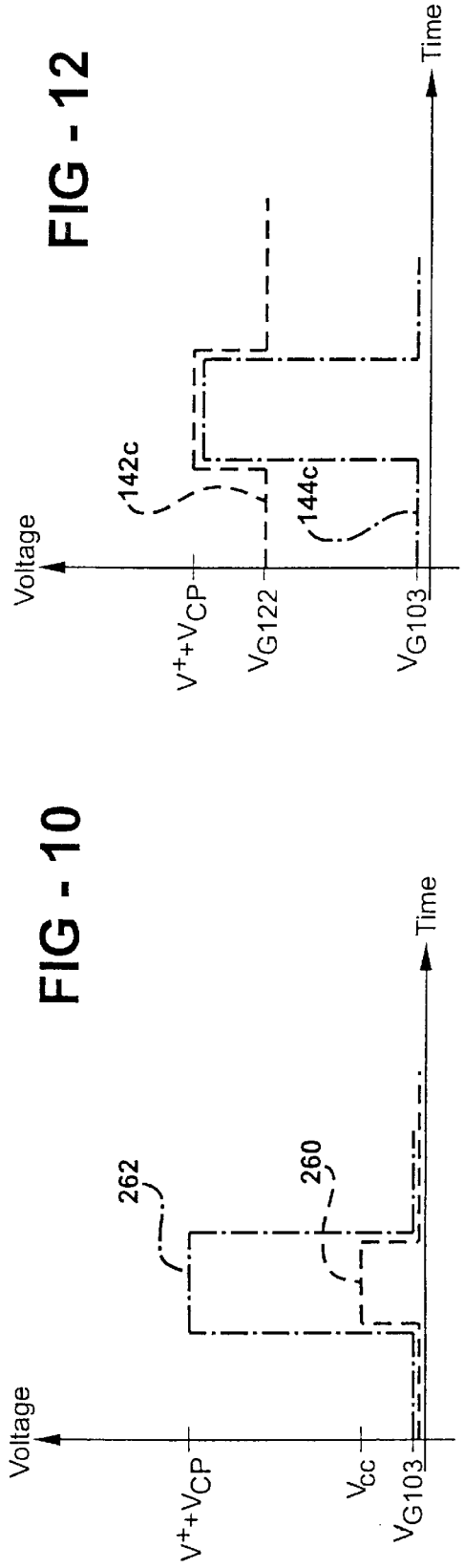
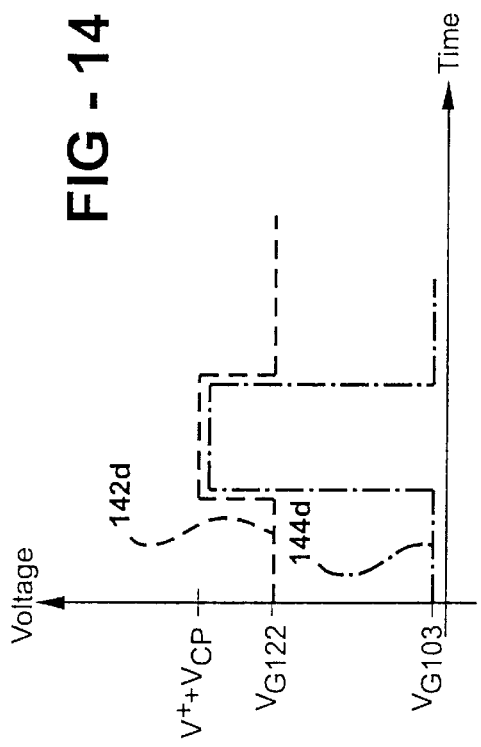

US 6,388,468 B1

CIRCUIT AND METHOD FOR OPERATING A MOSFET CONTROL CIRCUIT WITH A SYSTEM OPERATING VOLTAGE GREATER THAN A MAXIMUM SUPPLY VOLTAGE LIMIT

FIELD OF THE INVENTION

The present invention relates to MOSFET (Metal-Oxide-Semiconductor Field-Effect Transistor) control circuits.

BACKGROUND OF THE INVENTION

Most modern vehicles are equipped with an electrical supply which provides an operating voltage range between 8 volts and 14 volts. Typically, the power supply is a conventional vehicle battery which provides a standard system operating voltage of 12 volts.

To meet a demand for increased power, future vehicles will include a power supply which provides a higher system operating voltage range. One such high system operating voltage range is 25 volts to 55 volts with a standard system operating voltage of 42 volts.

For safety and reliability purposes, electrical systems are normally designed with a safety coefficient (e.g. 1.3–1.5). Thus, electrical components receiving a high system operating voltage range, having a maximum system operating voltage of 55 volts, must be capable of handling at least 72 volts (i.e. 55 volts×1.3–72 volts). Existing MOSFET control circuits cannot operate properly in a vehicle having a high system operating voltage range. Accordingly, it would be desirable to provide a circuit and method for operating a MOSFET control circuit, having a maximum supply voltage limit, with a system operating voltage greater than the maximum supply voltage limit.

SUMMARY OF THE INVENTION

The present invention provides a circuit for operating a MOSFET control circuit, having a maximum supply voltage limit, with a system operating voltage greater than the maximum supply voltage limit. A system operating voltage is referenced to a first ground. The MOSFET control circuit has a power supply input for receiving the system operating voltage and for generating a signal having a maximum voltage level and a minimum voltage level. A ground floating circuit includes a second ground, having a greater potential than the first ground, for establishing a voltage difference between the MOSFET control circuit power supply input and the second ground. The voltage difference is less than the maximum supply voltage limit. In one embodiment of the present invention, a first signal level shifting circuit shifts one of the maximum voltage level and the minimum voltage level of the signal from a first reference voltage to a second reference voltage. In another embodiment of the present invention, the first signal level shifting circuit receives the signal having the minimum voltage level referenced to a first reference voltage and produces a MOSFET activation signal having a minimum voltage level referenced to a second reference voltage.

The present invention also provides a method for operating a MOSFET control circuit, having a maximum supply voltage limit, with a system operating voltage greater than the maximum supply voltage limit. The system operating voltage is referenced to a first ground. The method provides a MOSFET control circuit having a power supply input for receiving the system operating voltage and for generating a signal having a maximum voltage level and a minimum voltage level; establishes a voltage difference with a ground floating circuit including a second ground, having a greater potential than the first ground, between the MOSFET control circuit power supply input and the second ground, the voltage difference being less than the maximum supply voltage limit; and shifts one of the maximum voltage level and the minimum voltage level of the signal from a first reference voltage to a second reference voltage with a first signal level shifting control.

Other features, advantages and applications of the present invention will become apparent to those skilled in the art when the following description of the best mode contemplated for practicing the invention is read in conjunction with the accompanying drawings.

BRIEF DESCRIPTION OF THE DRAWINGS

The description herein makes reference to the accompanying drawings wherein like reference numerals refer to like parts throughout the several views, and wherein:

FIG. 10 is a graph of an inner logic circuit output signal and a MOSFET control circuit activation signal from the fourth signal level shifting circuit illustrated in FIG. 9;

FIG. 12 is a graph of an output signal and a MOSFET activation signal from the still another embodiment of the first signal level shifting circuit illustrated in FIG. 11;

FIG. 14 is a graph of an output signal and a MOSFET activation signal from the yet still another embodiment of the first signal level shifting circuit illustrated in FIG. 13.

DESCRIPTION OF THE PREFERRED EMBODIMENT

Figure 1:
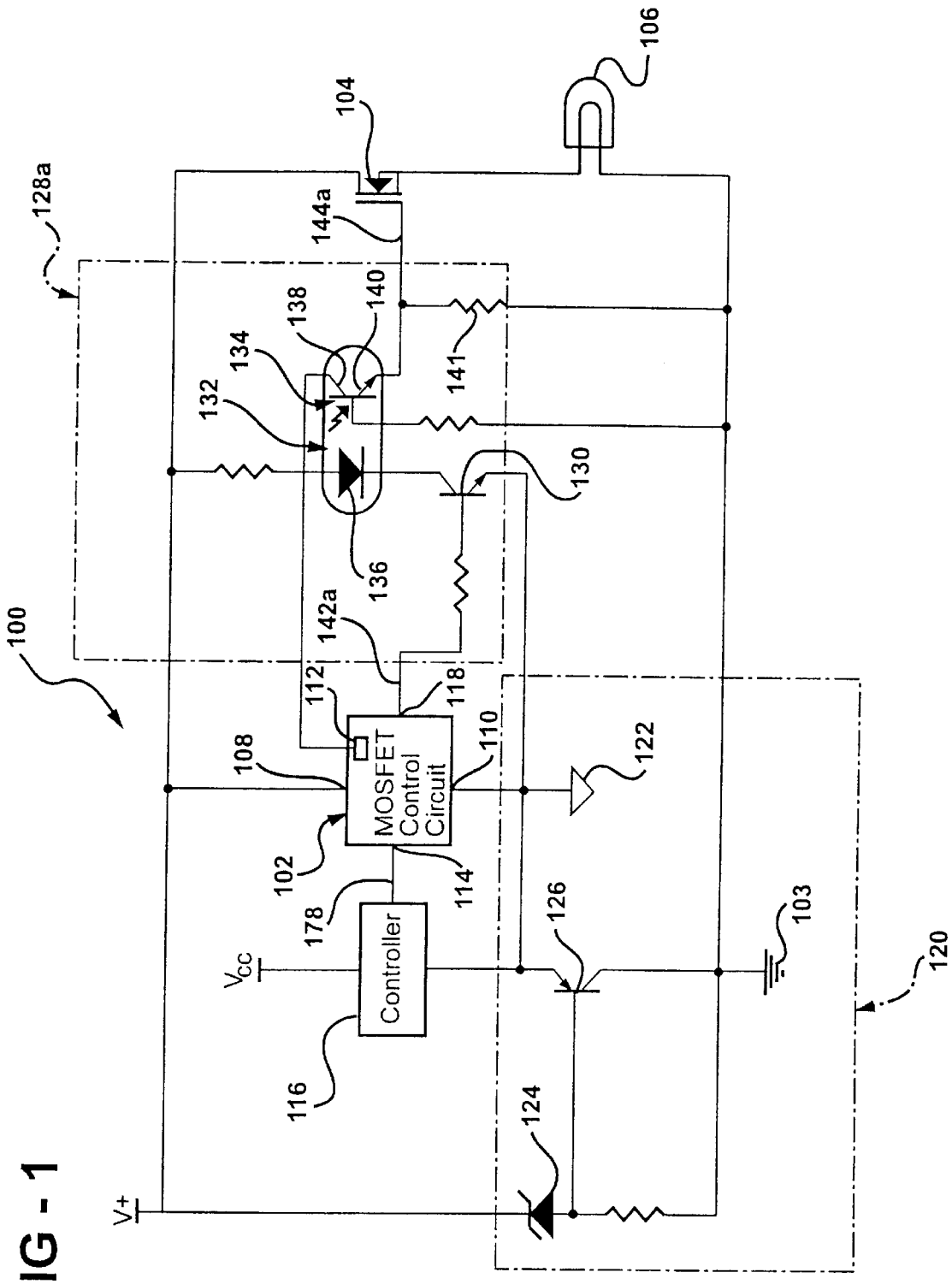
FIG. 1 is an electrical diagram of a first embodiment of a circuit, in accordance with the present invention, including a ground floating circuit and a first signal level shifting circuit.

FIG. 1 is an electrical diagram of a first embodiment of a circuit 100, in accordance with the present invention, for operating a high side n-channel MOSFET control circuit 102, having a maximum supply voltage limit, with a system operating voltage ($V^+$) greater than the maximum supply voltage limit. The system operating voltage ($V^+$) is referenced to a first ground 103. The first ground 103 is often referred to as a common or battery ground.

For descriptive purposes only and not to limit the scope of the present invention, an exemplary circuit 100 receives a system operating voltage ($V^+$) of 42 volts, and the MOSFET control circuit 102 has a maximum supply voltage limit of 18 volts. The exemplary system operating voltage ranges between a minimum voltage of 25 volts and a maximum voltage of 55 volts. However, the circuit 100 is capable of handling other high system operating voltages.

The MOSFET control circuit 102 is designed to control an external, main or load MOSFET 104 for switching power to a load 106. Thus, the MOSFET control circuit 102 may be a MOSFET driver. The MOSFET control circuit 102 has a power supply input 108 for receiving the system operating voltage ($V^+$), a ground 110, a charge pump or booster 112, at least one signal input 114 in electrical communication with a controller 116, and at least one output or gate 118 for providing an output signal 142a having a maximum voltage level and a minimum voltage level.

The present invention includes a ground floating circuit 120 connecting the MOSFET control circuit ground 110 to a second ground 122. The second ground 122 is commonly referred to as a floating ground. The second ground 122 has a greater electrical potential or voltage level than the first ground 103. The ground floating circuit 120 also establishes a voltage difference between the power supply input 108 and the MOSFET control circuit ground 110. To properly power the MOSFET control circuit 102, the voltage difference across the MOSFET control circuit 102 must be less than the maximum supply voltage limit or, in other words, in the recommended operating voltage range. Thus, in the exemplary circuit, the power supply input 108 receives the 42 volt system operating voltage, the first ground or battery ground 103 has a potential of 0 volts, the second ground or floating ground 122 has a potential of 30 volts, and the MOSFET control circuit has a maximum supply voltage limit of 18 volts. In this manner, a voltage difference of 12 volts (i.e. 42 volts–30 volts=12 volts) is established between the power supply input 108 and the MOSFET control circuit ground 110. The voltage difference of 12 volts is the recommended operating voltage and, thus, properly powers the MOSFET control circuit 102.

The ground floating circuit 120 includes a voltage clamp 124 and a transistor 126 which operate to establish the voltage difference between the power supply input 108 and the MOSFET control circuit ground 110. This voltage difference across the MOSFET control circuit 102 is equal to the constant voltage drop across the voltage clamp 124 minus a p-n junction forward voltage drop. In this manner, the ground floating circuit 120 establishes a constant voltage difference between the power supply input 108 and the MOSFET control circuit ground 110 which is unaffected by a varying system operating voltage ($V^+$). In the simplest embodiment, the voltage clam 124 is a Zener diode for establishing a constant voltage difference of 12 volts between the power supply input 108 and the MOSFET control circuit ground 110. To maintain the constant voltage difference of 12 volts, the potential of the second ground 122 must "float" as the system operating voltage ($V^+$) varies. In other words, if the system operating voltage ($V^+$) rises to 55 volts, the constant voltage difference across the MOSFET control circuit 102 floats the potential of the second ground 122 to 43 volts (i.e. 55 volts–12 volts=43 volts) and, if the system operating voltage ($V^+$) falls to 25 volts, the constant voltage difference across the MOSFET control circuit 102 floats the potential of the second ground 122 to 13 volts (i.e. 25 volts–12 volts=13 volts).

The controller 116 produces a control signal 178. In this first embodiment of the circuit 100, the controller 116 is connected through the ground floating circuit 120 to the second ground 122. Thus, in this first embodiment of the circuit 100, both the MOSFET control circuit 102 and the controller 116 are connected or referenced to the second ground 122. As a result, the control signal 178 produced by the controller 116 and supplied to the signal input 114 is compatible with the MOSFET control circuit 102 and, thus, no signal level shifting is necessary.

In this first embodiment of the circuit 100, the output signal 142a from the output 118 of the MOSFET control circuit 102 is referenced to the second ground 122 and the main MOSFET 104 is connected through the load 106 to the first ground 103. As a result, the output signal 142a produced by the MOSFET control circuit 102 is not compatible with the main MOSFET 104 and, thus, requires a signal level shifting. More specifically, with the output signal 142a referenced to the second ground 122, the output signal voltage does not drop to a voltage level low enough to switch the main MOSFET 104 OFF or to a non-conducting state. Accordingly, the present invention also includes a first signal level shifting circuit 128a for shifting one of the maximum voltage level and the minimum voltage level of the output signal 142a from the voltage level of the second ground 122 to the voltage level of the first ground 103.

The first signal level shifting circuit 128a includes a transistor 130 and an optocoupler 132. The transistor 130 is switched by the output signal 142a from the output 118 of the MOSFET control circuit 102. The optocoupler 132 includes a phototransistor 134 switched by a photodiode 136. The photodiode 136 is activated by the transistor 130. The phototransistor 134 includes a collector 138 in electrical communication with the charge pump 112 of the MOSFET control circuit 102.

In operation, the output signal 142a from the output 118 of the MOSFET control circuit 102 switches the transistor 130 ON and OFF or between conducting and non-conducting states respectively. When the transistor 130 is switched ON by a high output signal voltage, current flows through the photodiode 136 producing light. Light from the photodiode 136 switches the phototransistor 134 ON or to a conducting state. When the phototransistor 134 is switched ON, current from the charge pump 112 flows through the phototransistor 134, from the collector 138 to the emitter 140, to switch the main MOSFET 104 ON or to a conducting state. When the transistor 130 is switched OFF by a low output signal voltage, the photodiode 136 is deactivated, the phototransistor 134 is switched OFF or to a non-conducting state, and the main MOSFET 104 is switched OFF or to a non-conducting state because of a pull-down resistor 141. In this manner, the first signal level shifting circuit 128 receives the output signal 142a (shown in FIG. 2) having the minimum voltage level referenced to the second ground 122 and, in response, produces a MOSFET activation signal 144a (shown in FIG. 2), through the phototransistor 134 of the optocoupler 132, having a minimum voltage level referenced to the first ground 103. The MOSFET activation signal 144a is supplied to the main MOSFET 104.

The maximum system operating voltage (V$^+$) that the circuit 100 can handle is equal to the maximum voltage limit of the transistor 126. For example, if the maximum voltage limit of the transistor 126 is 100 volts, then the circuit 100 can handle a maximum system operating voltage (V$^+$) of 100 volts. The maximum supply voltage limit for the MOSFET control circuit 102 does not affect the maximum system operating voltage (V$^+$) that the circuit 100 can handle. By selecting a proper voltage clamp 124, the voltage difference between the power supply input 108 and the MOSFET control circuit ground 110 will be within the recommended operating voltage range for the MOSFET control circuit 102.

Figure 2:
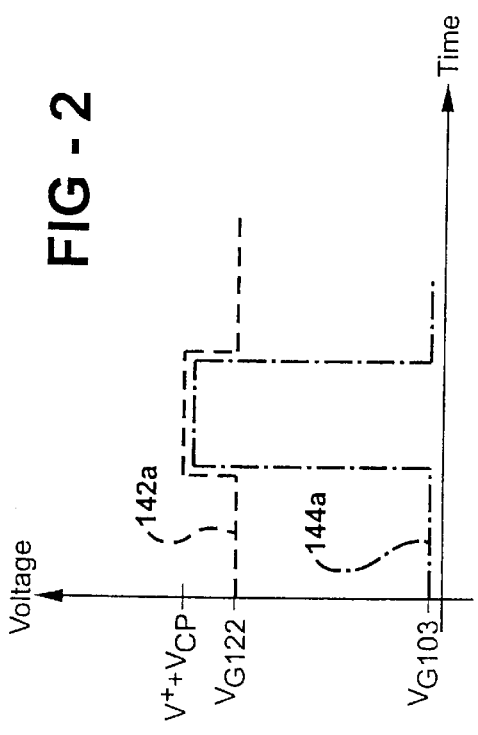
FIG. 2 is a graph of an output signal and a MOSFET activation signal from the first signal level shifting circuit illustrated in FIG. 1.

FIG. 2 is a graph of the output signal 142a illustrated with a dashed line and the MOSFET activation signal 144a illustrated with a dashed-dot line. In the exemplary circuit 100, the power supply input 108 of the MOSFET control circuit 102 receives the 42 volt system operating voltage (V$^+$), the voltage difference from the power supply input 108 to the ground 110 of the MOSFET control circuit 102 is 12 volts, the potential of the second ground (V$_{G122}$) is approximately equal to 30 volts, the potential of the first ground (V$_{G103}$) is equal to 0 volts, and the charge pump 112 provides a boost voltage (V$_{CP}$) of 10 volts. Thus, the minimum or low voltage of the output signal 142a is approximately equal to 30 volts and the maximum or high voltage of the output signal 142a is approximately equal to the system operating voltage (V$^+$) plus the charge pump boost voltage (V$_{CP}$) or 52 volts (i.e. 42 volts+10 volts=52 volts). The minimum or low voltage of the MOSFET activation signal 144a is approximately equal to 0 volts and the maximum or high voltage of the MOSFET activation signal 144a is approximately equal to 52 volts. The voltage of the output signal 142a (i.e. approximately 30 volts) cannot switch the main MOSFET 104 OFF or open. Instead, the main MOSFET 104 remains in a non-saturation ON or partly closed state. Consequently, there is a voltage of approximately 28 volts at the source of the main MOSFET 104. To switch the main MOSFET 104 OFF, the output signal 142a must be level shifted to produce the MOSFET activation signal 144a by means of the first signal level shifting circuit 128. Accordingly, the low voltage of the MOSFET activation signal 144a (i.e. 0 volts), which is supplied to the main MOSFET 104, is low enough to switch the main MOSFET 104 OFF.

Figure 4:
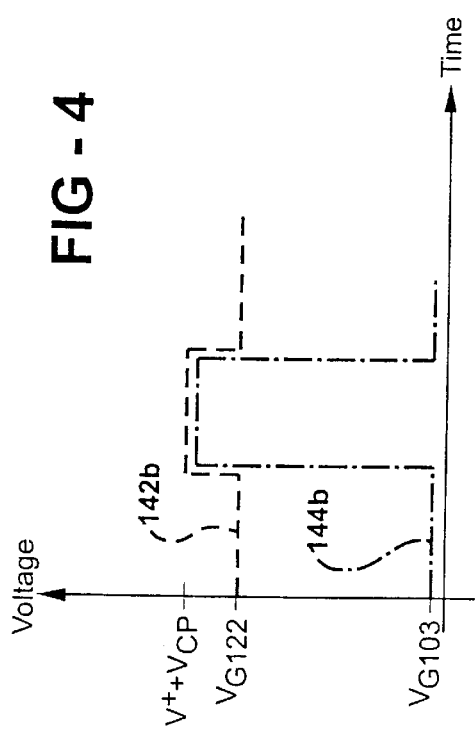
FIG. 4 is a graph of an output signal and a MOSFET activation signal from the another embodiment of the first signal level shifting circuit illustrated in FIG. 3.
Figure 3:
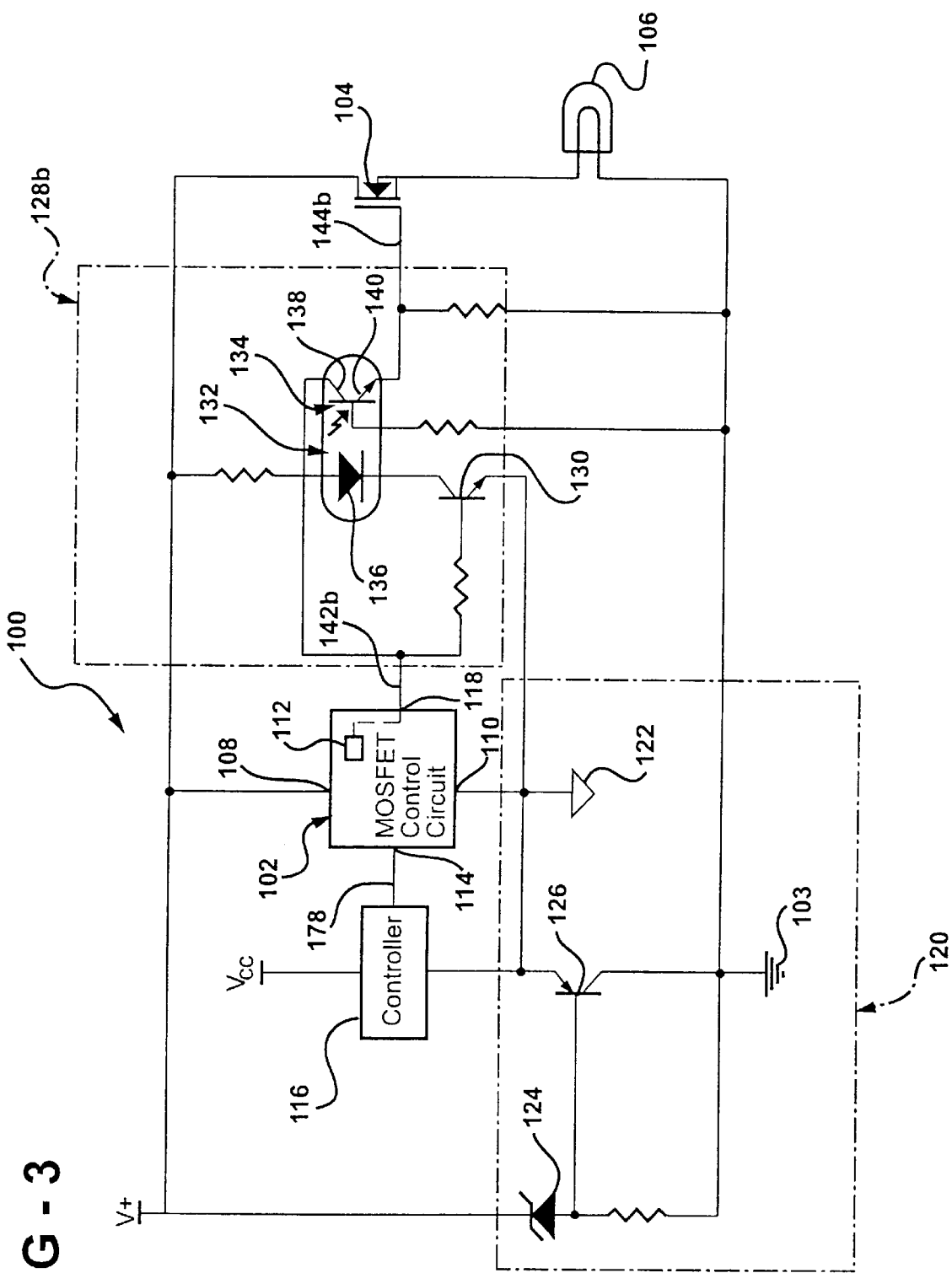
FIG. 3 is an electrical diagram of the circuit, in accordance with the present invention, including another embodiment of the first signal level shifting circuit illustrated in FIG. 1.

FIG. 3 is an electrical diagram of the circuit 100, in accordance with the present invention, including another embodiment of the first signal level shifting circuit 128b. In this embodiment of the first signal level shifting circuit 128b, the output signal 142b from the output 118 of the MOSFET control circuit 102 switches the transistor 130 ON and OFF as well as supplies power to the collector 138 of the phototransistor 134. Thus, when the phototransistor 134 is switched ON, current from the output signal 142b flows through the phototransistor 134, from the collector 138 to the emitter, to switch the main MOSFET 104 ON. In all other aspects, this embodiment of the first signal level shifting circuit 128b functions and operates as described above. In this manner, the first signal level shifting circuit 128b receives the output signal 142b (as shown in FIG. 4) having a minimum voltage level referenced to the second ground 122 and, in response, produces a MOSFET activation signal 144b (as shown in FIG. 4), through the phototransistor 134 of the optocoupler 132, having a minimum voltage level referenced to the first ground 103. The MOSFET activation signal 144b is supplied to the main MOSFET 104.

FIG. 4 is a graph of the output signal 142b illustrated with a dashed line and the MOSFET activation signal 144b illustrated with a dashed-dot line. In the exemplary circuit 100, the power supply input 108 of the MOSFET control circuit 102 receives the 42 volt system operating voltage (V$^+$), the voltage difference from the power supply input 108 to the ground 110 of the MOSFET control circuit 102 is 12 volts, the potential of the second ground (V$_{G122}$) is approximately equal to 30 volts, the potential of the first ground (V$_{G103}$) is equal to 0 volts, and the charge pump 112 provides a boost voltage (V$_{CP}$) of 10 volts. Thus, the minimum or low voltage of the output signal 142b is approximately equal to 30 volts and the maximum or high voltage of the output signal 142b is approximately equal to the system operating voltage (V$^+$) plus the charge pump boost voltage (V$_{CP}$) or 52 volts (i.e. 42 volts+10 volts=52 volts). The minimum or low voltage of the MOSFET activation signal 144b is approximately equal to 0 volts and the maximum or high voltage of the MOSFET activation signal 144b is approximately equal to 52 volts. The low voltage of the output signal 142a (i.e. approximately 30 volts) cannot switch the main MOSFET 104 OFF or open. Instead, the main MOSFET 104 remains in a non-saturation ON or partly closed state. Consequently, there is a voltage of approximately 28 volts at the source of the main MOSFET 104. To switch the main MOSFET 104 OFF, the output signal 142b must be level shifted to produce the MOSFET activation signal 144b by means of the first signal level shifting circuit 128. Accordingly, the low voltage of the MOSFET activation signal 142b (i.e. 0 volts), which is supplied to the main MOSFET 104, is low enough to switch the main MOSFET 104 OFF.

Figure 5:
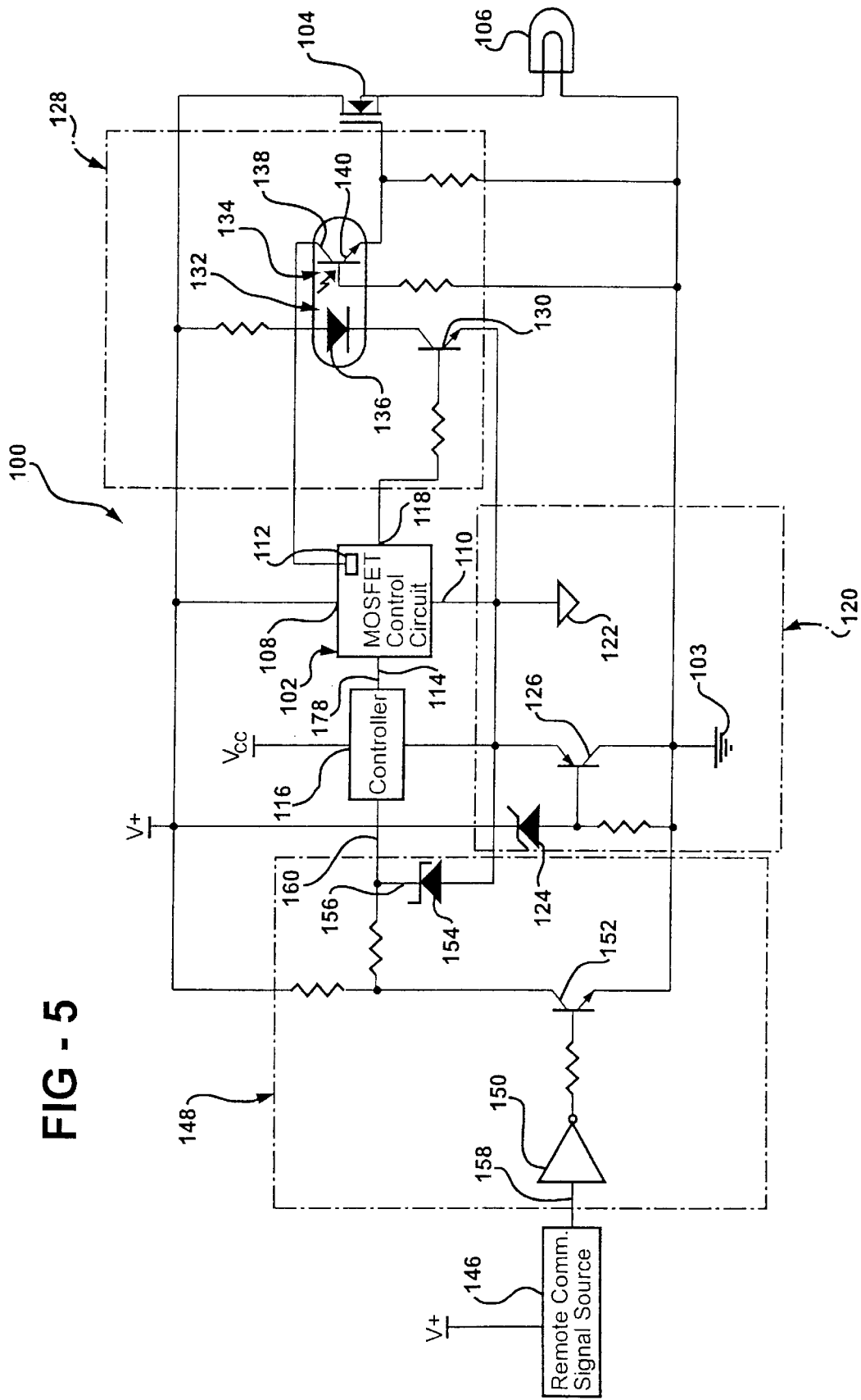
FIG. 5 is an electrical diagram of a second embodiment of the circuit, in accordance with the present invention, including a second signal level shifting circuit.

FIG. 5 is an electrical diagram of a second embodiment of the circuit 100, in accordance with the present invention, including a second signal level shifting circuit 148. In this second embodiment of the circuit 100, the controller 116 is in electrical communication with a remote communication signal source 146 producing a communication signal 158. The remote communication signal source 146 may be, for example, a body control module producing a communication signal 158 for switching internal or external vehicle lights ON or OFF. The remote communication signal source 146 is connected or referenced to the first ground 103 and the controller 116 is connected or referenced to the second ground 122. As a result, the communication signal 158 from the remote communication signal source 146 is not compatible with the controller 116. Accordingly, the present invention includes the second signal level shifting circuit 148 for shifting the reference of the communication signal 158 from the first ground 103 to the second ground 122.

The second signal level shifting circuit 148 includes an inverter 150, a transistor 152, and a bi-way voltage clamp 154. Preferably, the voltage clamp 154 is 4.7 volt Zener diode.

In operating, the communication signal 158 from the remote communication signal source 146 switches the transistor 152. When the communication signal 158 is a logic LOW voltage, the inverter 150 transmits a logic HIGH voltage to the transistor 152 switching the transistor 152 ON. With the transistor 152 ON, the voltage at the cathode 156 of the voltage clamp 154 is equal to the potential of the second ground 122 minus the forward voltage of the voltage clamp 154. This voltage is a logic LOW voltage for the controller 116. When the communication signal is a logic HIGH voltage, the inverter 150 transmits a logic LOW voltage to the transistor 152 switching the transistor 152 OFF. With the transistor 152 OFF, the voltage at the cathode 156 of the Zener diode 254 is equal to the potential of the second ground 122 plus the backward breakdown voltage of the voltage clamp 154. This voltage is a logic HIGH voltage for the controller 116. In this manner, the second signal level shifting circuit 148 receives the communication signal 158 referenced to the first ground 103 and, in response, produces a controller activation signal 160, at the cathode 156 of the Zener diode 154, referenced to the second ground 122. The controller activation signal 160 is supplied to the controller 116.

Figure 6:
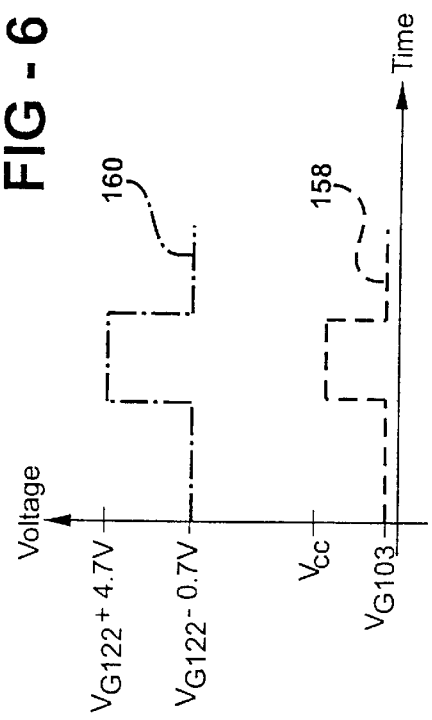
FIG. 6 is a graph of a communication signal and a controller activation signal from the second signal level shifting circuit illustrated in FIG. 5.

FIG. 6 is a graph of the communication signal 158 illustrated with a dashed line and the controller activation signal 160 illustrated with a dashed-dot line. In the exemplary circuit 100, the potential of the second ground ($V_{G112}$) is approximately equal to 30 volts and the Zener diode 154 has a backward breakdown voltage approximately equal to 4.7 volts and a forward voltage approximately equal to 0.7 volts. Thus, the minimum or low voltage of the controller activation signal 160 is approximately equal to 29.3 volts (i.e. 30 volts–0.7 volts=29.3 volts) and the maximum or high voltage of the controller activation signal 160 is approximately equal to 34.7 volts (i.e. 30 volts+4.7 volts=34.7 volts). The maximum or high voltage of the communication signal 158 (i.e. 5 volts) is below the potential of the second ground (i.e. 30 volts). If the communication signal 158 was directly input into the controller 116, the voltage difference of –25 volts (i.e. 5 volts–30 volts=25 volts) between the input node and the ground node of controller 116 would destroy the controller 116 and/or remote communication signal source 146. However, the high voltage of the controller activation signal 160 (i.e. 34.7 volts) is above the potential of the second ground (i.e. 30 volts) and, thus, the controller 116 recognizes the low voltage (i.e. 29.3 volts) as a logic LOW voltage and the high voltage (i.e. 34.7 volts) as a logic HIGH voltage.

Figure 7:
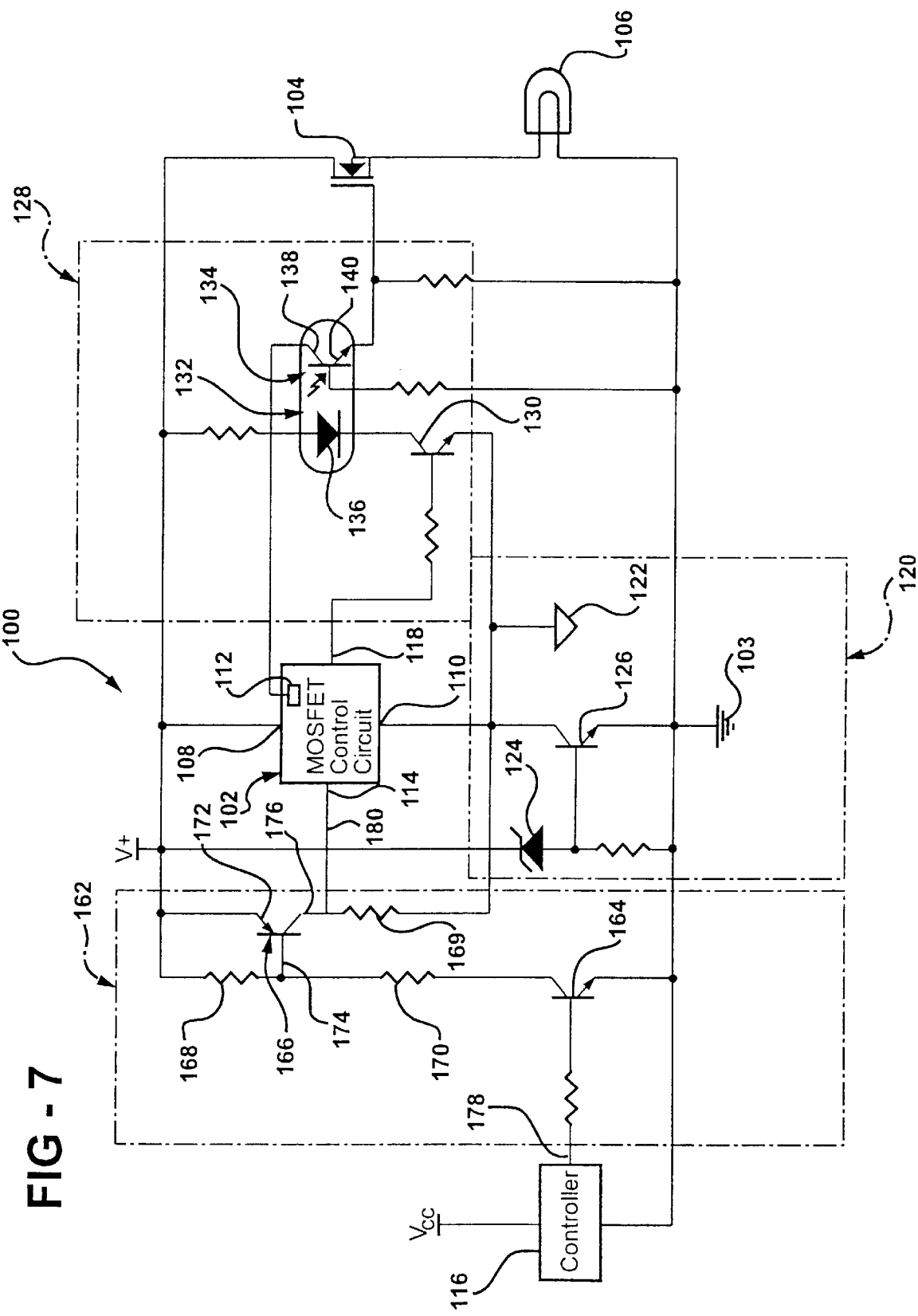
FIG. 7 is an electrical diagram of a third embodiment of the circuit, in accordance with the present invention, including a third signal level shifting circuit.

FIG. 7 is an electrical diagram of a third embodiment of the circuit 100, in accordance with the present invention, including a third signal level shifting circuit 162. In this third embodiment, the controller 116 is connected or referenced to the first ground 103 and the MOSFET control circuit 102 is connected or referenced to the second ground 122. As a result, the control signal 178 from the controller 116 is not compatible with the MOSFET control circuit 102. Accordingly, the present invention includes the third signal level shifting circuit 162, in electrical communication with the controller 116, for shifting the reference of the control signal 178 from the first ground 103 to the second ground 122.

The third signal level shifting circuit 162 includes first and second transistors 164 and 166 respectively and first and second resistors 168 and 170 respectively. The first transistor 164 is switched by the control signal 178 from the controller 116. The second transistor 166 is switched by the first transistor 164.

In operation, the control signal 178 from the controller 116 switches the first transistor 164 OFF and ON or between conducting and non-conducting states respectively. When the first transistor 164 is switched ON by a high control signal voltage, current flows through the two resistors 168 and 170 and the first transistor 164 to the first ground 103. Current flow through the first resistor 168 establishes a voltage drop from the emitter 172 to the base 174 of the second transistor 166 switching the second transistor 166 ON or to a conducting state. When the second transistor 166 is switched ON, the voltage at the collector 176 of the second transistor 166 is approximately equal to the system operating voltage ($V^+$). When the first transistor 164 is switched OFF by a low control signal voltage, the second transistor 166 is switched OFF or to a nonconducting state. When the second transistor 166 is switched OFF, the voltage at the collector 176 of the second transistor 166 is equal to the potential of the second ground 122 because of a pull-down resistor 169. In this manner, the third signal level shifting circuit 162 receives the controller signal 178 referenced to the first ground 103 and, in response, produces a MOSFET control circuit activation signal 180, through the second transistor 166, referenced to the second ground 122. The MOSFET control circuit activation signal 180 is supplied to the MOSFET control circuit 102. In comparison to the first embodiment of the circuit 100 shown in FIG. 1, the transistor 126 of the ground floating circuit 120 sinks less current and, therefore, is smaller in size and generates less heat.

Figure 8:
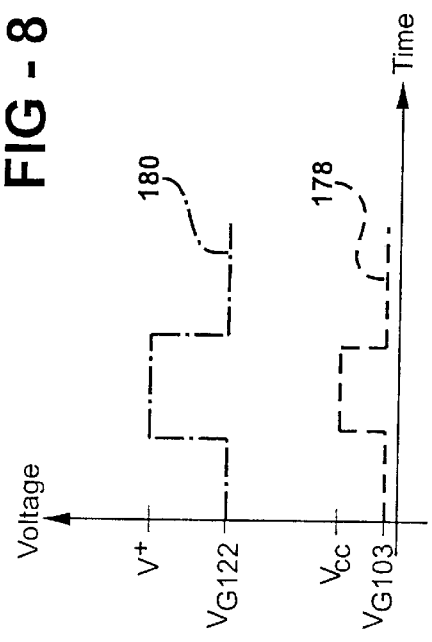
FIG. 8 is a graph of a control signal and a MOSFET control circuit activation signal from the third signal level shifting circuit illustrated in FIG. 7.

FIG. 8 is a graph of the control signal 178 illustrated with a dashed line and the MOSFET control circuit activation signal 180 illustrated with a dashed-dot line. In the exemplary circuit 100, the system operating voltage ($V^+$) is 42 volts and the potential of the second ground ($V_{G122}$) is approximately equal to 30 volts. Thus, the minimum or low voltage of the MOSFET control circuit activation signal 180 is approximately equal to 30 volts (i.e. the potential of the second ground) and the maximum or high voltage of the MOSFET control circuit activation signal 180 is approximately equal to 42 (i.e. the system operating voltage ($V^+$)). The maximum or high voltage of the controller signal 178 (i.e. 5 volts) is below the potential of the second ground (i.e. 30 volts). If the communication signal 158 was directly input into the controller 116, the voltage difference of –25 volts (i.e. 5 volts–30 volts=–25 volts) between the input node and the ground node of controller 116 would destroy the controller 116 and/or remote module 146. However, the high voltage of the MOSFET control circuit activation signal 180 (i.e. 42 volts) is above the potential of the second ground (i.e. 30 volts) and, thus, the MOSFET control circuit 102 recognizes the low voltage (i.e. 30 volts) as a logic LOW voltage and the high voltage (i.e. 42 volts) as a logic HIGH voltage.

Figure 9:
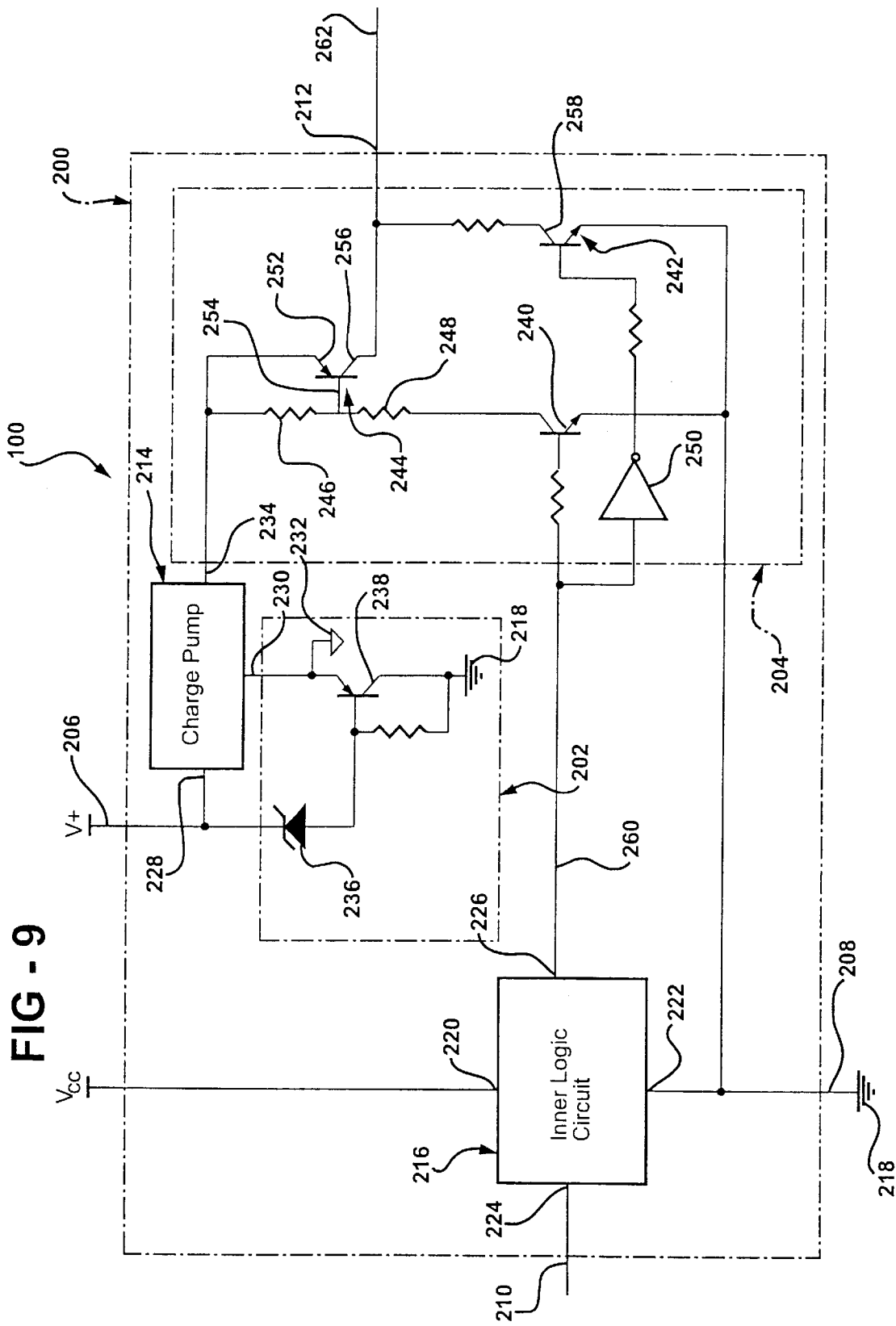
FIG. 9 is an electrical diagram of a fourth embodiment of the circuit, in accordance with the present invention, including a ground floating circuit and a fourth signal level shifting circuit incorporated into a MOSFET control circuit.

FIG. 9 is an electrical diagram of a fourth embodiment of the circuit 100, in accordance with the present invention, including a ground floating circuit 202 and a fourth signal level shifting circuit 204 incorporated into a MOSFET control circuit 200. The MOSFET control circuit 200 has a power supply input 206, a ground 208, at least one signal input 210, at least one output or gate 212, a charge pump 214, and inner logic circuit 216. The power supply input 206 receives a system operating voltage ($V^+$). The ground 208 of the MOSFET control circuit 200 is connected to a first ground 218 often referred to as a common or battery ground. The signal input 210 of the MOSFET control circuit 200 receives a control signal or MOSFET control circuit activation signal from a controller (not shown). The output 212 of the MOSFET control circuit 200 provides an output signal or MOSFET activation signal 262.

The inner logic circuit 216 includes a power supply input 220 for receiving a circuit voltage (Vcc), a ground 222 connected to the first ground 218, a signal input 224 for receiving the control signal or MOSFET control circuit activation signal from the controller (not shown), and an output 226 for providing an output signal 260 having a minimum voltage level and a maximum voltage level. Typically, the circuit voltage is 5 volts. The charge pump 214 includes a power supply input 228 for receiving the system operating voltage ($V^+$), a ground 230 connected to a second ground 232, and an output 234.

The ground floating circuit 202 connects the ground 230 of the charge pump 214 to the second ground 232. The second ground 232 is commonly referred to as a floating ground. The second ground 232 has a greater potential or voltage level than the first ground 218. The ground floating circuit 202 also establishes a voltage difference between the power supply input 228 and the ground 230 of the charge pump 214. To decrease the electric strain on charge pump-related components, the floating ground circuit 202 is employed to limit the operating voltage of the charge pump 214 to a proper operating voltage, e.g. 12 volts. Thus, in the exemplary circuit 100, the power supply input 228 of the charge pump 214 receives the 42 volt system operating voltage, the first ground or battery ground 218 has a potential of 0 volts, and the second ground or floating ground 232 has a potential of 30 volts. In this manner, a voltage difference of 12 volts (i.e. 42 volts–30 volts=12 volts) is established between the power supply input 228 and the ground 230 of the charge pump 214. In an integrated circuit, it is normally easier to handle a low voltage (e.g. 12 volts), than a high voltage (e.g. 42 volts).

The ground floating circuit 202 includes a voltage clamp 236 and a transistor 238 which operate to establish the voltage difference between the power supply input 228 and the ground 230 of the charge pump 214. This voltage difference across the charge pump 214 is equal to the constant voltage drop across the voltage clamp 236 minus a p-n junction forward voltage drop. In this manner, the ground floating circuit 202 establishes a constant voltage difference between the power supply input 228 and the ground 230 of the charge pump 214 which is unaffected by a varying system operating voltage $V^+$). In the simplest embodiment, the voltage clamp 236 is a Zener diode. In the exemplary circuit 100, the voltage clamp 236 is a conventional 12 volt Zener diode for establishing a constant voltage difference of 12 volts between the power supply input 228 and the ground 230 of the charge pump 214. To maintain the constant voltage difference of 12 volts, the potential of the second ground 232 must "float" as the system operating voltage ($V^+$) varies. In other words, if the system operating voltage $V^+$) rises to 55 volts, the constant voltage difference across the charge pump 214 floats the potential of the second ground 232 to 43 volts (i.e. 55 volts–12 volts+43 volts) and, if the system operating voltage ($V^+$) falls to 25 volts, the constant voltage difference across the charge pump 214 floats the potential of the second ground 232 to 13 volts (i.e. 25 volts–12 volts+13 volts).

In this fourth embodiment of the circuit 100, the MOSFET control circuit output signal 262 from the MOSFET control circuit output 212 is supplied to a MOSFET (not shown) powered with the system operating voltage ($V^+$) plus the charge pump boost voltage ($V_{CP}$) and grounded to the first ground 218. The inner logic circuit 216 is powered with the circuit voltage (Vcc) and grounded to the first ground 218. Thus, the inner logic circuit output signal 260 from the inner logic circuit output 226 varies from approximately 0 volts to 5 volts. As a result, the inner logic circuit output signal 260 is not compatible with the MOSFET and, thus, requires a signal level shifting. More specifically, the voltage level of the inner logic circuit output signal 260 does not rise to a voltage level high enough to switch the MOSFET ON or to a conducting state. Accordingly, the present invention also includes a fourth signal level shifting circuit 204 for shifting the maximum voltage level of the inner logic circuit output signal 260 from the circuit voltage ($V_{cc}$) to a voltage level of the charge pump output signal ($V^+ + V_{CP}$)

The fourth signal level shifting circuit 204 includes first, second, and third transistors 240, 242, and 244 respectively, first and second resistors 246 and 248 respectively, and an inverter 250 that functions as an interlocker. The first and second transistors 240 and 242 are switched by the inner logic circuit output signal 260 from the inner logic circuit output 226. The third transistor 244 is switched by the first transistor 240.

In operation, when the inner logic circuit output signal 260 is a logic HIGH voltage, the first transistor 240 is switched ON or to a conducting state and the inverter 250 transmits a logic LOW voltage to switch the second transistor 242 OFF or to a non-conducting state. With the first transistor 240 switched ON, current flows through the two resistors 246 and 248 and the first transistor 240 to the first ground 218. Current flow through the first resistor 246 establishes a voltage drop from the emitter 252 to the base 254 of the third transistor 244 switching the third transistor 244 ON or to a conducting state. When the third transistor 244 is switched ON, the voltage at the collector 256 of the third transistor 244 is approximately equal to the system operating voltage plus the charge pump boost voltage ($V^+ + V_{CP}$). When the inner logic circuit output signal 260 is a logic LOW voltage, the first transistor 240 is switched OFF or to a non-conducting state and the inverter 250 transmits a logic HIGH voltage to switch the second transistor 242 ON or to a conducting state. When the first transistor 240 is switched OFF, the third transistor 244 is switched OFF or to a non-conducting state. When the third transistor 244 is switched OFF and the second transistor 242 is switched ON, the voltage at the output 212 of the MOSFET control circuit 200 is approximately equal to the potential of the first ground 218. In this manner, the fourth signal level shifting circuit 204 receives the inner logic circuit output signal 260, e.g. TTL level logic signal, and, in response, produces a MOSFET activation signal 262, through the third transistor 244, referenced to the system operating voltage $V^+$) plus the charge pump boost voltage ($V_{CP}$). The MOSFET activation signal 262 is supplied to the MOSFET control circuit output 212.

FIG. 10 is a graph of the inner logic circuit output signal 260 illustrated with a dashed line and the MOSFET activation signal 262 illustrated with a dashed-dot line. In the exemplary circuit 100, the power supply input 228 of the charge pump 214 receives a system operating voltage ($V^+$) of 42 volts, the power supply input 220 of the inner logic circuit 216 receives a circuit voltage (Vcc) of 5 volts, and the potential of the first ground ($V_{G218}$) is equal to 0 volts. Thus, the minimum or low voltage of the inner logic circuit output signal 260 is approximately equal to 0 volts and the maximum or high voltage of the inner logic circuit output signal 260 is approximately equal to 5 volts. The minimum or low voltage of the MOSFET activation signal 262 is approximately equal to 0 volts and the maximum or high voltage of the MOSFET activation signal 262 is approximately equal to 52 volts (i.e. $V^+ + V_{CP}$ or 42 volts+10 volts=52 volts). The high voltage of the inner logic circuit output signal 260 (i.e. 5 volts) is not high enough to switch the MOSFET into saturation ON state. However, the high voltage of the MOSFET activation signal 262 (i.e. 52 volts), which is supplied to the MOSFET, is high enough to switch the MOSFET ON.

Figure 11:
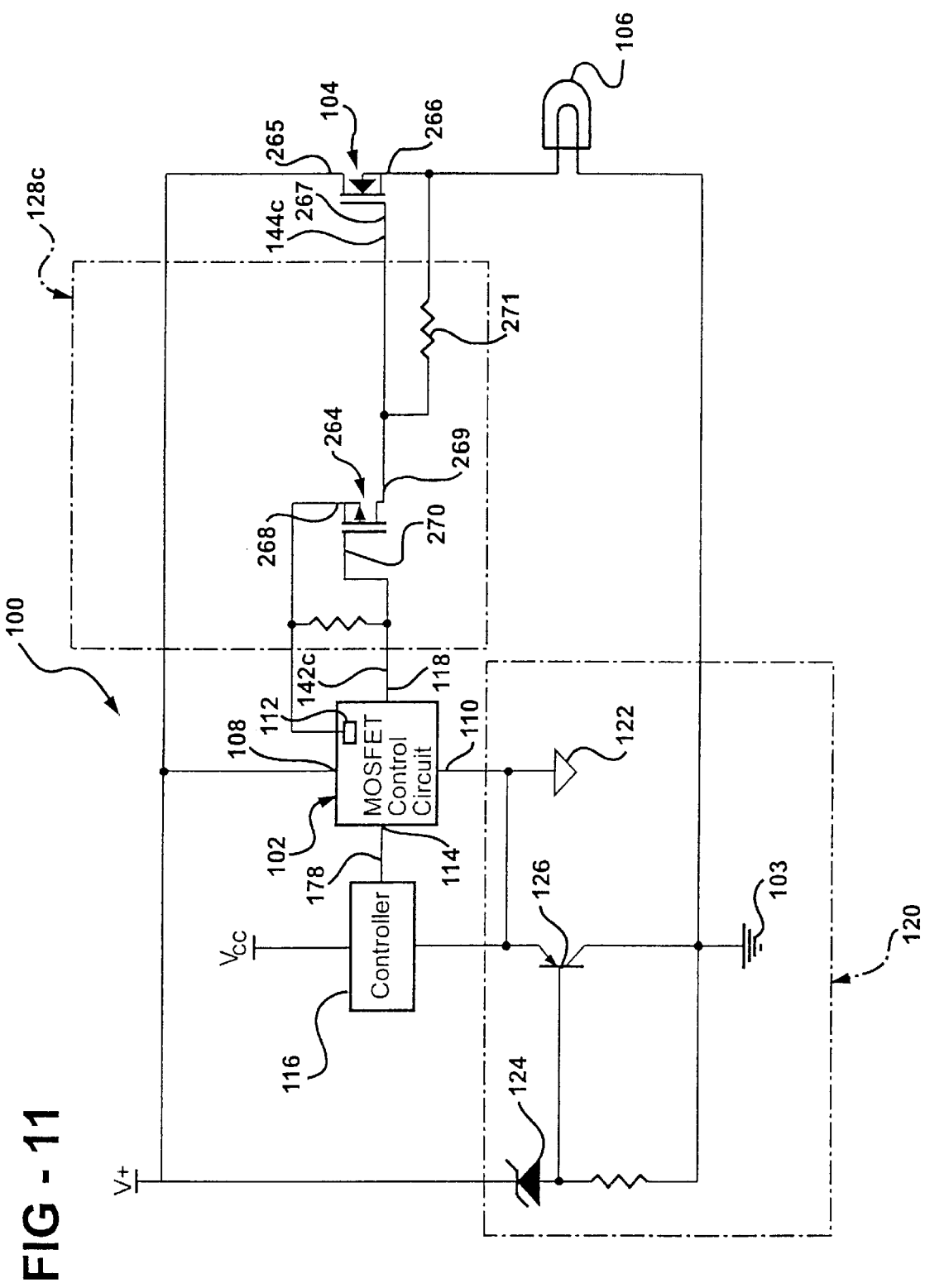
FIG. 11 is an electrical diagram of the circuit, in accordance with the present invention, including still another embodiment of the first signal level shifting circuit illustrated in FIG. 1.

FIG. 11 is an electrical diagram of the circuit 100, in accordance with the present invention, including still another embodiment of the first signal level shifting circuit 128c. In this embodiment of the first signal level shifting circuit 128c, the main MOSFET 104 is switched by a second MOSFET 264. This is an inverted function level shifting circuit. The main MOSFET 104 includes a drain 265 receiving the system operating voltage (V+), a source 266 in electrical communication with the load 106, and a gate 267. The second MOSFET 264 includes a source 268 in electrical communication with the charge pump 112, a drain 269 in electrical communication with the gate 267 of the main MOSFET 104, and a gate 270 in electrical communication with the output 118 of the MOSFET control circuit 102. This embodiment of the first signal level shifting circuit 128c further includes a drain resistor 271 in electrical communication between the drain gate 267 of the main MOSFET 104 and the source 266 of the main MOSFET 104.

In operation, when an output signal 142c from the output 118 of the MOSFET control circuit 102 is a logic LOW voltage, the gate 270 of the second MOSFET 264 receives a logic LOW voltage and the second MOSFET 264 is switched ON or to a conducting state. The voltage level of the logic LOW voltage is equal to the potential of the second ground 122. Since the potential of the second ground 122 is at least 10 volts less than the voltage from the charge pump 112, the second MOSFET 264 turns into saturation. When the second MOSFET 264 is switched ON, the gate 267 of the main MOSFET 104 receives a MOSFET activation signal 144c, approximately equal to the system operating voltage V+) plus the charge pump boost voltage ($V_{CP}$), and the main MOSFET 104 is switched ON or to a conducting state. When the output signal 142c from the output 118 of the MOSFET control circuit 102 is a logic HIGH voltage, the gate 270 of the second MOSFET 264 receives a logic HIGH voltage and the second MOSFET 264 is switched OFF or to a non-conducting state. The remaining electrical charge on the gate 267 of the main MOSFET 104 is drained through the source resistor 271 to the load 106. In this embodiment of the first signal level shifting circuit 128c, the main MOSFET 104 is switched OFF rapidly. In this manner, the first signal level shifting circuit 128c receives the output signal 142c having a minimum voltage level referenced to the second ground 122 and, in response, produces a MOSFET activation signal 144c, through the second MOSFET 264, having a minimum voltage level referenced to the first ground 103. This embodiment of the first signal level shifting circuit 128c is adapted to be used with MOSFET control circuits having separate charge pump output.

FIG. 12 is a graph of the output signal 142c illustrated with a dashed line and the MOSFET activation signal 144c illustrated with a dashed-dot line. In the exemplary circuit 100, the power supply input 108 of the MOSFET control circuit 102 receives the 42 volt system operating voltage V+), the voltage difference from the power supply input 108 to the ground 110 of the MOSFET control circuit 102 is 12 volts, the potential of the second ground ($V_{G122}$) is approximately equal to 30 volts, the potential of the first ground ($V_{G103}$) is equal to 0 volts, and the charge pump 112 provides a boost voltage ($V_{CP}$) of 10 volts. Thus, the minimum or low voltage of the output signal 142c is approximately equal to 30 volts and the maximum or high voltage of the output signal 142c is approximately equal to the system operating voltage (V+) plus the charge pump boost voltage ($V_{CP}$) or 52 volts (i.e. 42 volts+10 volts=52 volts). The minimum or low voltage of the MOSFET activation signal 144c is approximately equal to 0 volts and the maximum or high voltage of the MOSFET activation signal 144c is approximately equal to 52 volts. The low voltage of the output signal 142c (i.e. approximately 30 volts) cannot switch the main MOSFET 104 OFF or open. Instead, the main MOSFET 104 remains in a non-saturation ON or partly closed state. Consequently, there is a voltage of approximately 28 volts at the source of the main MOSFET 104. To switch the main MOSFET 104 OFF, the output signal 142c must be level shifted to produce the MOSFET activation signal 144c by means of the first signal level shifting circuit 128. Accordingly, the low voltage of the MOSFET activation signal 144c (i.e. 0 volts), which is supplied to the main MOSFET 104, is low enough to switch the main MOSFET 104 OFF.

Figure 13:
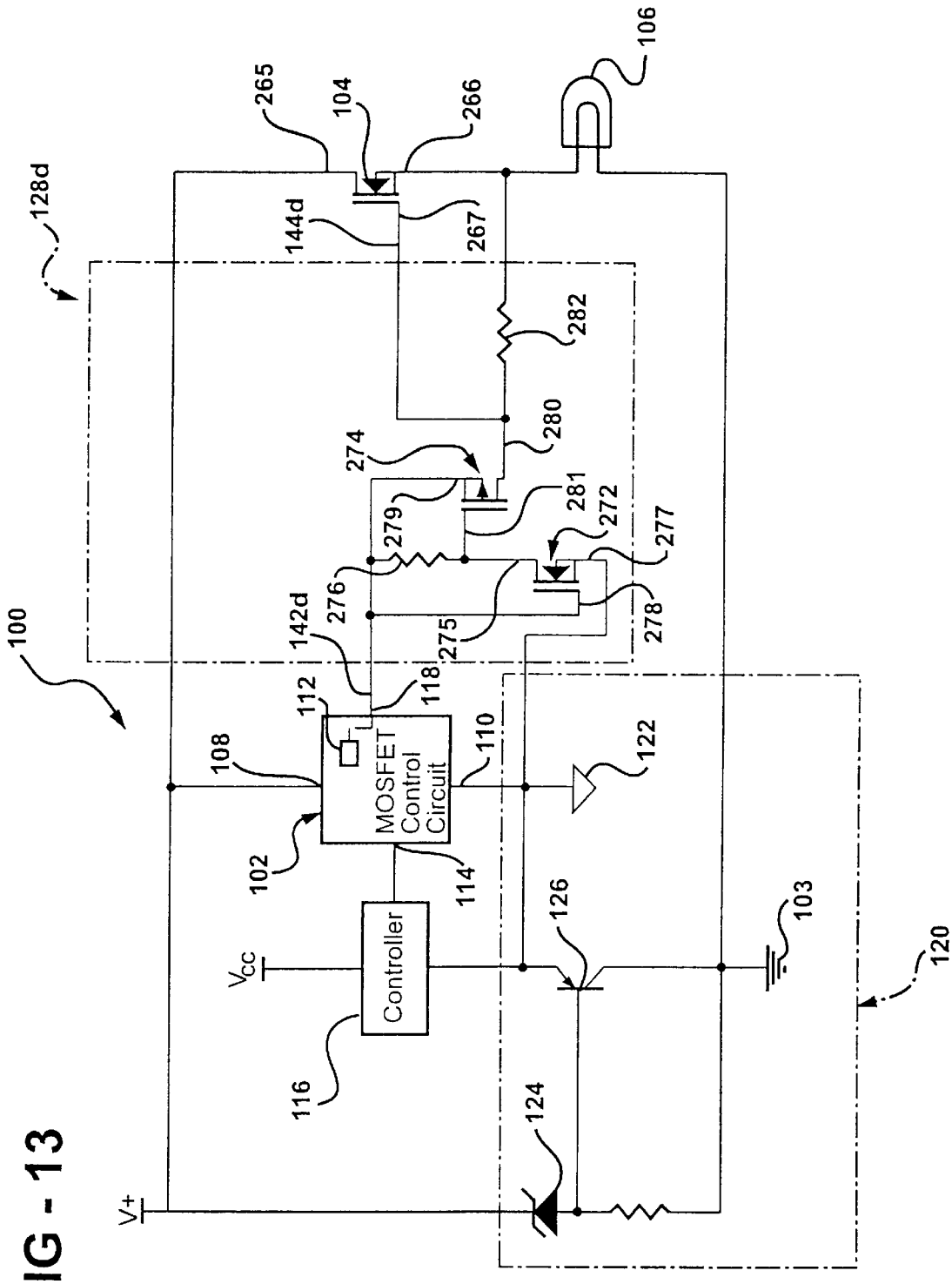
FIG. 13 is an electrical diagram of the circuit, in accordance with the present invention, including yet still another embodiment of the first signal level shifting circuit illustrated in FIG. 1.

FIG. 13 is an electrical diagram of the circuit 100, in accordance with the present invention, including yet still another embodiment of the first signal level shifting circuit 128d. This embodiment of the first signal level shifting circuit 128d includes a second and third MOSFET 272 and 274 respectively. The third MOSFET 274 is switched by the second MOSFET 272 and the main MOSFET 104 is switched by third MOSFET 274. This is a non-inverted level shifting circuit. The main MOSFET 104 includes a source 265 receiving the system operating voltage V+), a source 266 in electrical communication with the load 106, and a gate 267. The second MOSFET 272 includes a drain 275 in electrical communication through a resistor 276 with the output 118 of the MOSFET control circuit 102, a source 277 in electrical communication with the second ground 122, and a gate 278 in electrical communication with the output 118 of the MOSFET control circuit 102. The third MOSFET 274 includes a source 279 in electrical communication with the output 118 of the MOSFET control circuit 102, a drain 280 in electrical communication with the gate 267 of the main MOSFET 104, and a gate 281 electrically connected between the resistor 276 and the drain 275 of the second MOSFET 272. This embodiment of the first signal level shifting circuit 128d further includes a source resistor 282 in electrical communication between the gate 267 of the main MOSFET 104 and the source 266 of the main MOSFET 104.

In operation, when the output signal 142d from the output 118 of the MOSFET control circuit 102 is a logic HIGH voltage, the gate 278 of the second MOSFET 272 receives a logic HIGH voltage and the second MOSFET 272 is switched ON or to a conducting state. When the second MOSFET 272 is switched ON, the -voltage level at gate 281 of the third MOSFET 274 is pulled down to the potential of the second ground 122 and the voltage level at the drain 280 of the third MOSFET 274 is approximately equal to the system operating voltage plus the charge pump boost voltage. The third MOSFET 274 is switched ON or to a conducting state and into saturation. The voltage level at the gate 267 of the main MOSFET 104 is approximately equal to the system operating voltage plus the charge pump boost voltage and the main MOSFET 104 is switched ON or to a conducting state. When the output signal 142d from the output 118 of the MOSFET control circuit 102 is a logic LOW voltage, the gate 278 of the second MOSFET 272 receives a logic LOW voltage and the second MOSFET 272 is switched OFF or to a non-conducting state. When the second MOSFET 272 is switched OFF, the third MOSFET 274 is switched OFF or to a non-conducting state. When the third MOSFET 274 is switched OFF, the main MOSFET 104 is switched OFF or to a non-conducting state. The remaining electrical charge on the gate 267 of the main MOSFET 104 is drained through the source resistor 282 to the load 106. In this embodiment of the first signal level shifting circuit 128d, the main MOSFET 104 is switched OFF rapidly. In this manner, the first signal level shifting circuit 128d receives the output signal 142d having a minimum voltage level referenced to the second ground 122 and, in response, produces a MOSFET activation signal 144d, through the third MOSFET 274, having a minimum voltage level referenced to the first ground 103. This embodiment of the first signal level shifting circuit 128d is adapted to be used with MOSFET control circuits with or without separate charge pump outputs.

FIG. 14 is a graph of the output signal 142d illustrated with a dashed line and the MOSFET activation signal 144d illustrated with a dashed-dot line. In the exemplary circuit 100, the power supply input 108 of the MOSFET control circuit 102 receives the 42 volt system operating voltage (V⁺), the voltage difference from the power supply input 108 to the ground 110 of the MOSFET control circuit 102 is 12 volts, the potential of the second ground ($V_{G122}$) is approximately equal to 30 volts, the potential of the first ground ($V_{G103}$) is equal to 0 volts, and the charge pump 112 provides a boost voltage ($V_{CP}$) of 10 volts. Thus, the minimum or low voltage of the output signal 142d is approximately equal to 30 volts and the maximum or high voltage of the output signal 142d is approximately equal to the system operating voltage (V⁺) plus the charge pump boost voltage ($V_{CP}$) or 52 volts (i.e. 42 volts+10 volts=52 volts). The minimum or low voltage of the MOSFET activation signal 144d is approximately equal to 0 volts and the maximum or high voltage of the MOSFET activation signal 144d is approximately equal to 52 volts. The low voltage of the output signal 142d (i.e. approximately 30 volts) cannot switch the main MOSFET 104 OFF or open. Instead, the main MOSFET 104 remains in a non-saturation ON or partly closed state. Consequently, there is a voltage of approximately 28 volts at the source of the main MOSFET 104. To switch the main MOSFET 104 OFF, the output signal 142d must be level shifted to produce the MOSFET activation signal 144d by means of the first signal level shifting circuit 128. Accordingly, the low voltage of the MOSFET activation signal 144d (i.e. 0 volts), which is supplied to the main MOSFET 104, is low enough to switch the main MOSFET 104 OFF.

The embodiments of the first signal level shifting circuits 128c and 128d, illustrated in FIGS. 11 and 13 respectively, can switch the main MOSFET 104 ON and OFF at high frequency rates, are small in size, have a high reliability, are easy to implement, and are inexpensive.

In one aspect, the present invention enables the use of an existing n-channel MOSFET control circuit in electrical systems having a system operating voltage greater than the maximum voltage limit of the MOSFET control circuit. In this manner, many features of existing n-channel MOSFET control circuits, including current limitation and short circuit protection, are preserved.

In another aspect, the present invention can be integrated into a MOSFET control circuit to operate the circuit with a high system operating voltage.

What is claimed is:

1. A circuit for operating a MOSFET control circuit having a maximum supply voltage limit with a system operating voltage greater than the maximum supply voltage limit, the system operating voltage referenced to a first ground, the circuit comprising:
    a MOSFET control circuit having a power supply input for receiving the system operating voltage and for generating an output signal having a maximum voltage level and a minimum voltage level;
    a ground floating circuit connected to the MOSFET control circuit for providing a second ground having a greater potential than the first ground and for establishing a voltage difference between the MOSFET control circuit power supply input and the second ground, the voltage difference being less than the maximum supply voltage limit; and
    a first signal level shifting circuit for shifting one of the maximum voltage level and the minimum voltage level of the signal from a first reference voltage related to the second ground voltage to a second reference voltage related to the first ground voltage.

2. The circuit as set forth in claim 1 wherein the first reference voltage is a voltage level of the second ground, the second reference voltage is a voltage level of the first ground, the MOSFET control circuit has a ground and at least one output for providing the output signal, the ground floating circuit connects the MOSFET control circuit ground to the second ground for establishing the voltage difference between the MOSFET control circuit power supply input and the MOSFET control circuit ground, and the first signal level shifting circuit is in electrical communication with the MOSFET control circuit output for shifting the minimum voltage level of the MOSFET control circuit output signal from the voltage level of the second ground to the voltage level of the first ground.

3. The circuit as set forth in claim 2 wherein the ground floating circuit includes a voltage clamp for establishing the voltage difference between the MOSFET control circuit power supply input and the MOSFET control circuit ground.

4. The circuit as set forth in claim 3 wherein the voltage clamp is a Zener diode.

5. The circuit as set forth in claim 2 wherein the first signal level shifting circuit includes a transistor switched by the MOSFET control circuit output signal from the MOSFET control circuit output.

6. The circuit as set forth in claim 5 wherein the first signal level shifting circuit includes an optocoupler activated by the transistor.

7. The circuit as set forth in claim 6 wherein the optocoupler includes a phototransistor switched by a photodiode.

8. The circuit as set forth in claim 7 wherein the photodiode is activated by the transistor.

9. The circuit as set forth in claim 8 wherein the MOSFET control circuit includes a charge pump in electrical communication with the phototransistor.

10. The circuit as set forth in claim 8 wherein the MOSFET control circuit output signal is connected to the transistor.

11. The circuit as set forth in claim 2 further comprising:
    a main MOSFET, having a gate, switched ON and OFF to provide power to a load; and
    the first signal level shifting circuit including a second MOSFET, switched ON and OFF by the MOSFET control circuit output signal from the MOSFET control circuit output, for providing power to the gate of the main MOSFET when the second MOSFET is switched ON, and a pull-down resistor, in electrical communication between the second MOSFET and the main MOSFET, for draining current from the gate of the main MOSFET to the load when the second MOSFET and the main MOSFET are switched OFF.

12. The circuit as set forth in claim 2 further comprising:
    a main MOSFET, having a gate, switched ON and OFF to provide power to a load; and
    the first signal level shifting circuit including a second MOSFET, switched ON and OFF by the MOSFET control circuit output signal from the MOSFET control circuit output, a third MOSFET, switched ON and OFF by the second MOSFET, for providing power to the gate of the main MOSFET when the third MOSFET is switched ON, and a pull-down resistor, in electrical communication between the third MOSFET and the main MOSFET, for draining current from the gate of the main MOSFET to the load when the third MOSFET and main MOSFET are switched OFF.

13. The circuit as set forth in claim 2 wherein the MOSFET control circuit further includes at least one signal input in electrical communication with a controller connected through the ground floating circuit to the second ground and producing a control signal.

14. The circuit as set forth in claim 13 wherein the controller is in electrical communication with a remote communication signal source connected to the first ground and producing a communication signal referenced to the first ground and including a second signal level shifting circuit, in electrical communication with the remote communication signal source, for shifting the reference of the communication signal from the first ground to the second ground.

15. The circuit as set forth in claim 2 wherein the MOSFET control circuit further includes at least one signal input in electrical communication with a controller connected to the first ground and producing a control signal referenced to the first ground.

16. The circuit as set forth in claim 15 including a third signal level shifting circuit, in electrical communication with the controller, for shifting the reference of the control signal from the first ground to the second ground.

17. The circuit as set forth in claim 1 wherein the MOSFET control circuit further comprises a charge pump having a power supply input for receiving the system operating voltage, at least one output for providing an output signal, and a ground, and an inner logic circuit having a power supply input for receiving a circuit voltage, at least one output for providing an output signal, and a ground connected to the first ground, and wherein the signal is the inner logic circuit output signal, the first reference voltage is the circuit voltage, the second reference voltage is a voltage level of charge pump output signal, the ground floating circuit connects the charge pump ground to the second ground for establishing the voltage difference between the charge pump power supply input and the charge pump ground, and the first signal level shifting circuit is in electrical communication with the inner logic circuit output, for shifting the maximum voltage level of the inner logic circuit output signal from the circuit voltage to a voltage level of the charge pump output signal.

18. A circuit for operating a MOSFET control circuit having a maximum supply voltage limit with a system operating voltage greater than the maximum supply voltage limit, the system operating voltage referenced to a first ground, the circuit comprising:

a MOSFET control circuit having a power supply input for receiving the system operating voltage and for generating a signal having a maximum voltage level and a minimum voltage level;

a ground floating circuit connected to the MOSFET control circuit for providing a second ground having a greater potential than the first ground for establishing a voltage difference between the MOSFET control circuit power supply input and the second ground, the voltage difference being less than the maximum supply voltage limit; and a first signal level shifting circuit for receiving the signal having the minimum voltage level reference to the second ground voltage and producing a MOSFET activation signal having a minimum voltage level referenced to the first ground voltage.

19. A method for operating a MOSFET control circuit, having a maximum supply voltage limit, with a system operating voltage greater than the maximum supply voltage limit, the system operating voltage referenced to a first ground, comprising the steps of:

providing a MOSFET control circuit having a power supply input for receiving the system operating voltage and for generating a signal having a maximum voltage level and a minimum voltage level;

establishing a voltage difference with a ground floating circuit including a second ground having a greater potential than the first ground between the MOSFET control circuit power supply input and the second ground, the voltage difference being less than the maximum supply voltage limit; and shifting one of the maximum voltage level and the minimum voltage level of the signal from a first reference voltage related to a second ground voltage to a second reference voltage related to the first ground voltage.

20. The method of claim 19 wherein the step of shifting includes shifting the minimum voltage level of the signal from a voltage level of the second ground to a voltage level of the first ground.

21. The method of claim 19 further comprising the steps of:

providing a charge pump having a power supply input for receiving the system operating voltage and at least one output for providing an output signal; and providing an inner logic circuit having a power supply input for receiving a circuit voltage and at least one output for providing the signal; and wherein the step of shifting includes shifting the maximum voltage level of the signal from the circuit voltage to a voltage level of the charge pump output signal.

* * * * *